United States Patent
Verma et al.

(10) Patent No.: US 6,980,025 B1
(45) Date of Patent: Dec. 27, 2005

(54) PROGRAMMABLE FUNCTION GENERATOR AND METHOD OPERATING AS COMBINATIONAL, SEQUENTIAL, AND ROUTING CELLS

(75) Inventors: Hare Krishna Verma, San Jose, CA (US); Ashok Vittal, Fremont, CA (US)

(73) Assignee: Velogix, Inc., Santa Clara, CA (US)

( * ) Notice: Subject to any disclaimer, the term of this patent is extended or adjusted under 35 U.S.C. 154(b) by 36 days.

(21) Appl. No.: 10/654,517

(22) Filed: Sep. 2, 2003

(51) Int. Cl.[7] ............................................. H03K 19/177
(52) U.S. Cl. ............................................ 326/40; 326/47
(58) Field of Search ......................... 326/37–41, 46–47

(56) References Cited

U.S. PATENT DOCUMENTS

| | | | | |
|---|---|---|---|---|
| 5,500,608 A | * | 3/1996 | Goetting et al. | 326/39 |
| 6,690,194 B1 | * | 2/2004 | How et al. | 326/39 |
| 6,774,668 B1 | * | 8/2004 | Wirtz, II | 326/37 |

* cited by examiner

*Primary Examiner*—James H. Cho
(74) *Attorney, Agent, or Firm*—Peter Jonlin Su

(57) ABSTRACT

A function generator is described that can be configured as a combinational logic, sequential logic, or routing cell. The function generator couples to a plurality of selector blocks that select a wire from a plurality of inputs. The selected wires are inputs to a function generator. The function generator, when configured as a combinational logic cell, can generate any function of its inputs. The function generator, when configured as a sequential logic cell, behaves as a register, where any of the inputs can be directed to input data, clear, clock enable, or reset signals. The register is configurable to a falling or rising edge flip-flop or a positive or negative level sensitive latch. As a routing element, logic cells selects one of its inputs. The output of the programmable cell can fan out to one or more inputs of another integrated cell.

8 Claims, 6 Drawing Sheets

FIG. 2A  inv – Inverter
o = 1 if i = 0;   o = 0 if i = 1
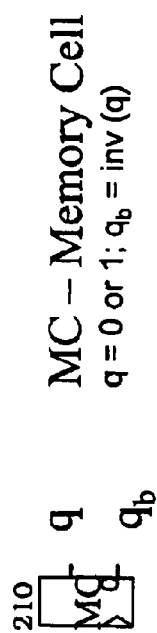
FIG. 2B  MC – Memory Cell
q = 0 or 1; $q_b$ = inv (q)
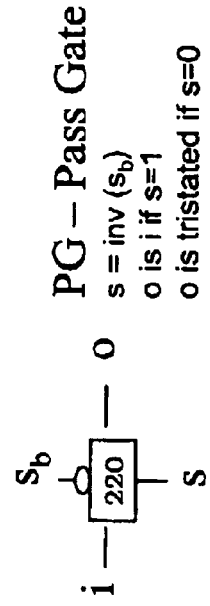
FIG. 2C  PG – Pass Gate
s = inv ($s_b$)
o is i if s=1
o is tristated if s=0
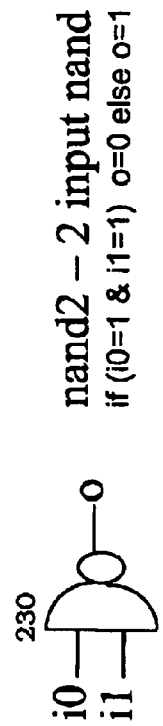
FIG. 2D  nand2 – 2 input nand
if (i0=1 & i1=1) o=0 else o=1
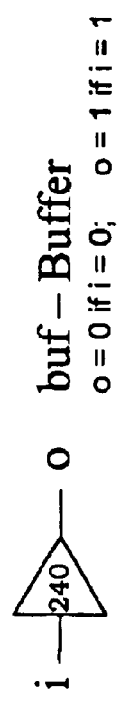
FIG. 2E  buf – Buffer
o = 0 if i = 0;   o = 1 if i = 1

PROGRAMMABLE FUNCTION GENERATOR AND METHOD OPERATING AS COMBINATIONAL, SEQUENTIAL, AND ROUTING CELLS

CROSS REFERENCE TO RELATED APPLICATIONS

This application relates to a co-pending U.S. patent application Ser. No. 10/319,720, entitled "Programmable Integrated Circuit Architecture" by Ashok Vittal and Hare K. Verma, filed on Dec. 13, 2002, owned by the assignee of this application and incorporated herein by reference.

BACKGROUND INFORMATION

1. Field of Invention

The invention relates to a programmable integrated cell containing one or more of combinational logic cells, sequential logic cells and routing cells for use in a programmable architecture integrated circuit (IC).

2. Description of Related Art

Field programmable gate arrays (FPGAs) typically enable user programming of integrated circuits (ICs), but result in slower performance (clock speed) because of the delays through the transistors, switches or multiplexers used to program the interconnects between configurable logic elements. Each logic element can be connected to a multitude of other logic elements through switches, in which the path from one programmable logic element to the next may be strewn with many switches, slowing down circuit operation. Some paths in a programmable IC, however, are not as critical as others. Therefore, a customized programmable IC can be designed where speed in the critical paths are optimized over other non-critical paths.

Routing elements have increasingly been added to programmable logic devices/ICs such that routing elements now typically occupy a much larger area than configurable logic elements themselves. Compounding to the problem is the fact that routing delays are typically much greater than logic delays, resulting in a slow operating clock frequency. In a conventional implementation, a large fraction of the routing elements may be redundant.

Accordingly, it is desirable to have a programmable architecture that provides a greater flexibility of logic and routing elements in an FPGA chip.

SUMMARY OF THE INVENTION

The present invention describes a programmable function generator that can be configured as a combinational logic function generator, a sequential logic function generator or a routing function generator. The programmable function generator couples to a plurality of selector blocks that select a wire from a plurality of inputs from each selector block. The selected wires are transmitted to the inputs of the programmable function generator. The programmable function generator, when configured as a combination logic cell, can generate any function from the inputs. The programmable function generator, when configured as a sequential logic cell, behaves as a register, where any of the inputs can be directed to input data, clear, clock enable or reset signals. The register is configurable to a falling or rising edge flip-flop or a positive or negative level sensitive latch. As a routing element, logic cells select from one of its inputs. The output of the programmable cell can fan out to one or more inputs of another programmable cell.

The programmable function generator employs programmable cells comprising of logic cells and routing cells. A logic cell comprises a combinational cell, a sequential cell or any combination of these cells. A routing cell routes wires to the logic cells. Each programmable cell can be dynamically allocated as a logic cell or a routing cell. In addition, the current invention comprises a timing driven placement method that routes critical wires in such a way that routing delays are minimized, resulting in a faster operating clock frequency.

A programmable function generator $FG_n$ having n-inputs, comprises an n-inputs combinational function generator having a set of configuration memory cells; a sequential function generator coupled to the n-inputs combinational function generator, the sequential function greater having a set of configuration memory cells; a route function generator, coupled to the sequential function generator, the route function generator having a set of configuration memory cells; wherein the programmable function generator is configured to function either as the n-inputs combinational function generator in response to the programming of the set of configuration memory cells in the n-inputs combinational function generator, the sequential function generator in response to the programming of the set of configuration memory cells in the sequential function generator, or the route function generator in response to the programming of the set of configuration memory cells in the route function generator or in any combination thereof.

Advantageously, the present invention provides a significantly more efficient use of the physical dimension on a silicon.

BRIEF DESCRIPTION OF THE DRAWINGS

FIGS. 2A–2E are circuit diagrams illustrating an exemplary set of electronic components for constructing the programmable function generator in accordance with the present invention.

DETAILED DESCRIPTION OF PREFERRED EMBODIMENTS

Figure 1:
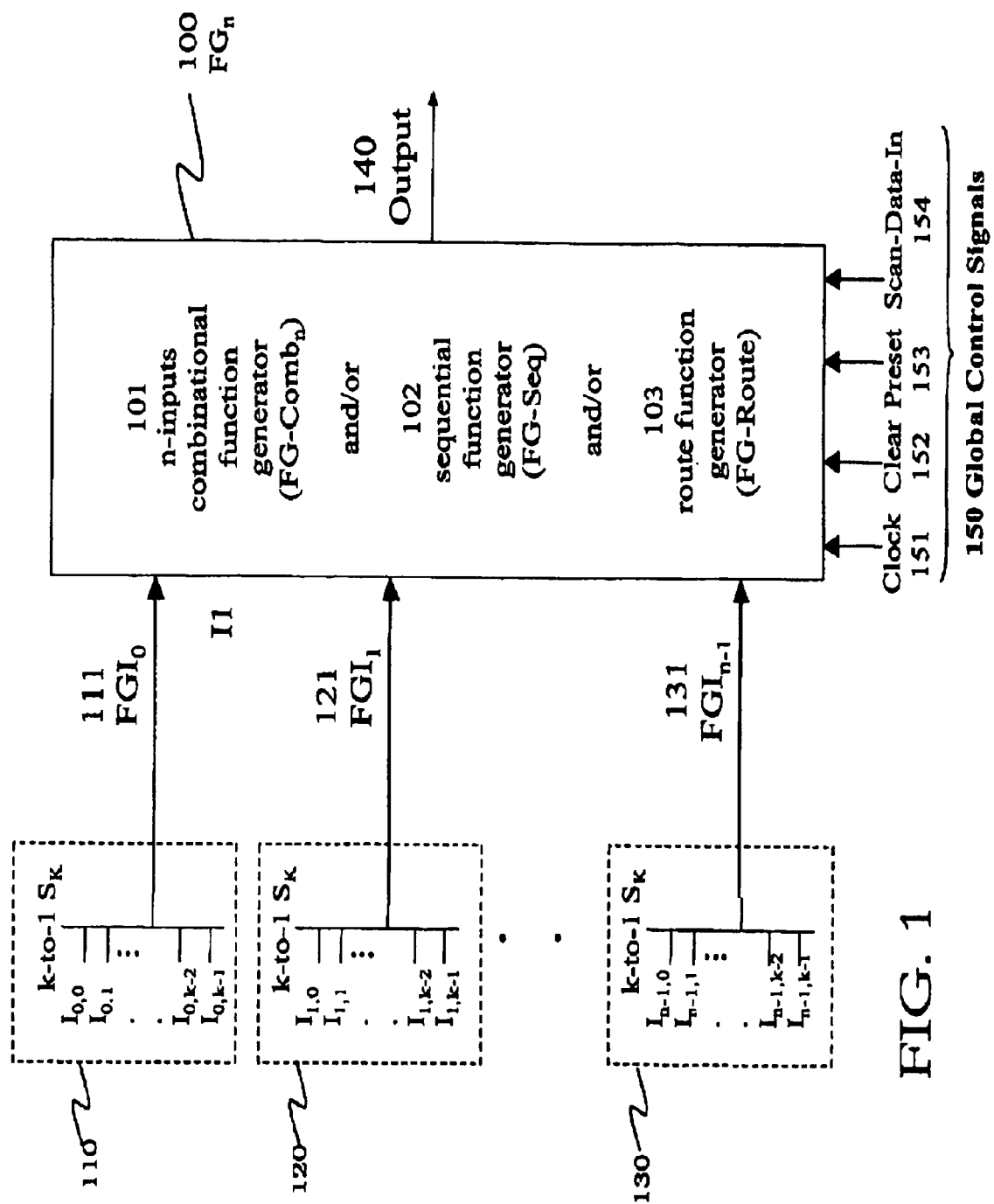
FIG. 1 is an architectural diagram illustrating a programmable function generator in accordance with the present invention.

FIG. 1 shows a programmable function generator $FG_n$ 100 comprises an n-inputs combinational function generator (FG-Comb$_n$) 101, and/or a sequential function generator (FG-Seq) 102, and/or a routing function generator (FG- Route) 103. The programmable function generator 100 can be configured as (1) an n-inputs combinational function generator, (2) a sequential function generator, (3) a routing function generator, (4) a combination of the n-inputs combinational function generator and the sequential function generator, (5) a combination of the n-inputs combinational function generator and the routing function generator, (6) a combination of the sequential function generator and the routing function generator, or (7) a combination of the n-inputs combinational function generator, the sequential function generator and the routing function generator.

The programmable functional generator $FG_n$ 100 having n-inputs that is capable of generating combinational, sequential or routing functions. The n-inputs combinational function generator $FG\text{-}Comb_n$ 101 has a set of configuration memory cells. The set of configuration memory cells can be configured in the $FG\text{-}Comb_n$ 101 for generating any n-inputs combinational function. The sequential function generator FG-Seq 102 has a set of configuration memory cells. The input signals into the FG-Seq 102 cell include data, clock enable, clock, clear or preset signals, which are directed to a register within the FG-Seq 102 function generator. Configuration memory cells can be configured in the FG-Seq 102 function generator as a rising edge flip-flop, a falling edge flip-flop, a positive level sensitive latch of a negative level sensitive latch.

The programmable function generator 100 employs programmable cells where each programmable cell comprises a logic cell and a routing cell in the same programmable cell. Each programmable cell can be configured as a logic cell or a routing cell, or a combination of partial logic cell and a partial routing cell.

The programmable function generator 100 is coupled to a first Sk selector input block 110, a second Sk selector input block 120 and a third Sk selector input block 130. Each Sk selector input block selects from among one of its k inputs. Memory cells are used to configure the selected input. The first selector input block 110 has a set of input signals, where each input signal is either a logic input signal or a routing input signal, from $I_{0,0}, I_{0,1}, \ldots I_{0,k-2}$ and $I_{0,k-1}$. The second input block 120 has a set of input signals, where each input signal is either a logic input signal or a routing input signal, from $I_{1,0}, I_{1,1}, \ldots I_{1,k-2}$ and $I_{1,k-1}$. The third selector input block 130 has a set of input signals, where each input signal is either a logic input signal or a routing input signal, from $I_{n-1,0}, I_{n-1,1}, \ldots I_{n-1,k-2}$ and $I_{n-1,k-1}$.

On the inputs, the programmable function generator 110 receives a $FGI_0$ input signal 111, a $FGI_1$ input signal 121 and a $FGI_{n-1}$ input signal 131. The function generator 100 receives the $FGI_0$ input signal 111 from the first selector block 110 where one of the $I_{0,0}, I_{0,1}, \ldots I_{0,k-2}$ and $I_{0,k-1}$ signals is selected. The programmable function generator 100 receives the $FGI_1$ 121 signal from the second selector block 120 where one of the $I_{1,0}, I_{1,1}, \ldots I_{1,k-2}$, and $I_{1,k-1}$ signals is selected. The programmable function generator 100 receives the $FGI_{n-1}$ 131 signal from the third selector block 130 where one of the $I_{n-1,0}, I_{n-1,1}, \ldots I_{n-1,k-2}$ and $I_{n-1,k-1}$ signals is selected. After configuring memory cells in the programmable function generator 100 in response to receiving the input signals $FGI_0$ 111, the $FGI_1$ 121, and the $FGI_{n-1}$ 131, the programmable functional generator 100 generates an output signal 140 that can be either a logic signal, a routing signal or a combinational of both.

In addition to the inputs from the selector blocks 110, 120, and 130, the function generator 100 further receives a set of global control signals 150 including a clock signal 151, a clear signal 152, a present signal 153 and a scan-data-in signal 154.

An exemplary set of electronic components for constructing the programmable function generator 100 in accordance with the present invention are shown in FIGS. 2A–2E, which includes an inverter 200, a memory cell 210, a pass gate 220, a 2-inputs NAND gate 230 and a buffer 240.

Figure 3:
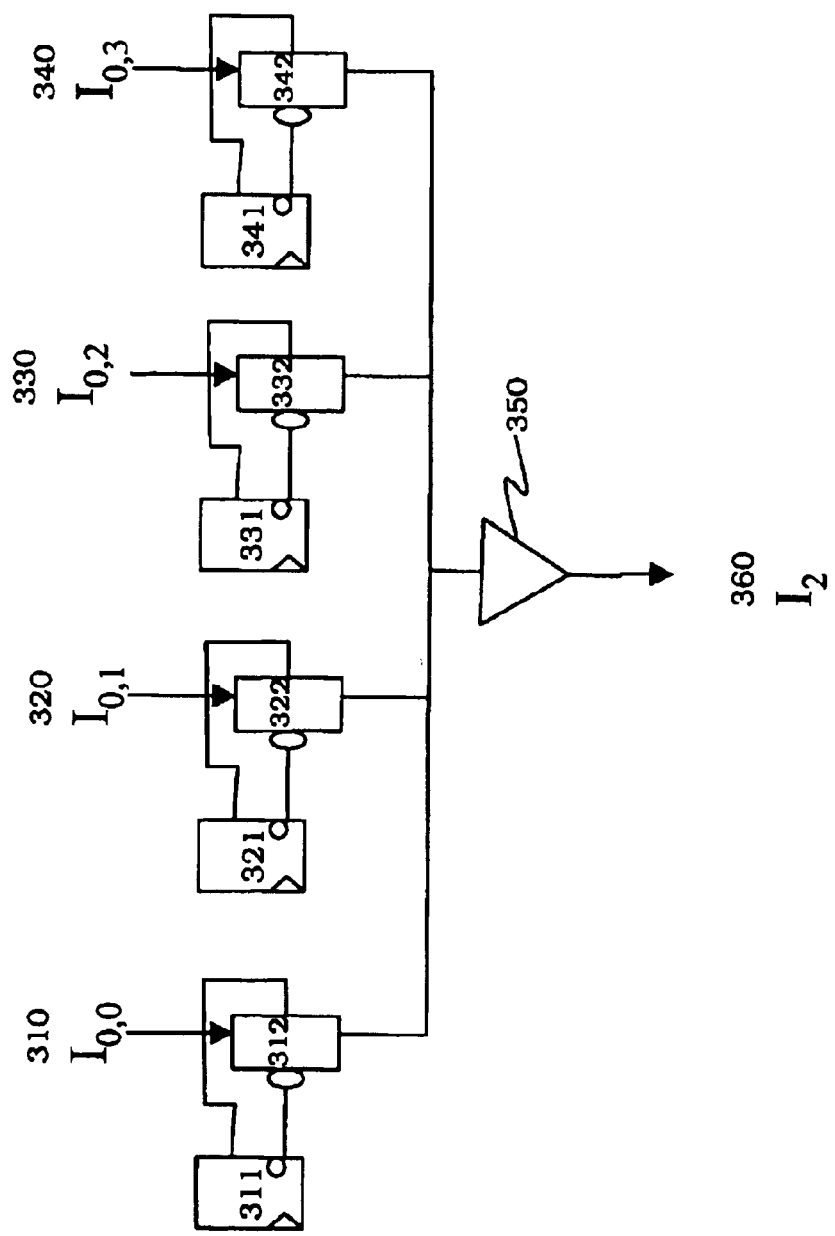
FIG. 3 is a circuit diagram illustrating an exemplary implementation of the programmable function generator operating as a 4-to-1 selector circuit in accordance with the present invention.

FIG. 3 is a circuit diagram illustrating an exemplary implementation of the programmable function generating 100 operating as a 4-to-1 selector circuit 300 in accordance with the present invention. The 4-to-1 selector 300 is a partial representation from the selector block 110 and is intended for illustration purposes. The 4-to-1 selector 300 selects from one of the four inputs (or k-1 inputs from the selector block 110) from among $I_{0,0}$ 310, $I_{0,1}$ 320, $I_{0,2}$ 330 and $I_{0,3}$ 340 input signals.

The 4-to-1 selector circuit 300 comprises a first memory cell 311, a first pass gate 312, a second memory cell 321, a second pass gate 322, a third memory cell 331, a third pass gate 332, a fourth memory cell 341 and a fourth pass gate 342. The first memory cell 311 stores the information received from the $I_{0,0}$ 310 input signal. The second memory cell 321 stores the information received from the $I_{0,1}$ 320 input signal. The second memory cell 331 stores the information received from the $I_{0,3}$ 330 input signal. The fourth memory cell 341 stores the information received from the $I_{0,4}$ 340 input signal.

When the first pass gate 312 is turned ON, the 4-to-1 selector circuit 300 selects the $I_{0,0}$ 310 input signal for generating an output signal 360. When the second pass gate 322 is turned ON, the 4-to-1 selector circuit 300 selects the $I_{0,1}$ 320 input signal for generating an output signal 360. When the third pass gate 322 is turned ON, the 4-to-1 selector circuit 300 selects the $I_{0,2}$ 330 input signal for generating an output signal 160. When the fourth pass gate 342 is turned ON, the 4-to-1 selector circuit 300 selects the $I_{0,4}$ 340 input signal for generating an output signal 360. A buffer 350 is placed before the selected input signal for buffer a delay prior to generating the output signal 360.

Figure 4C:
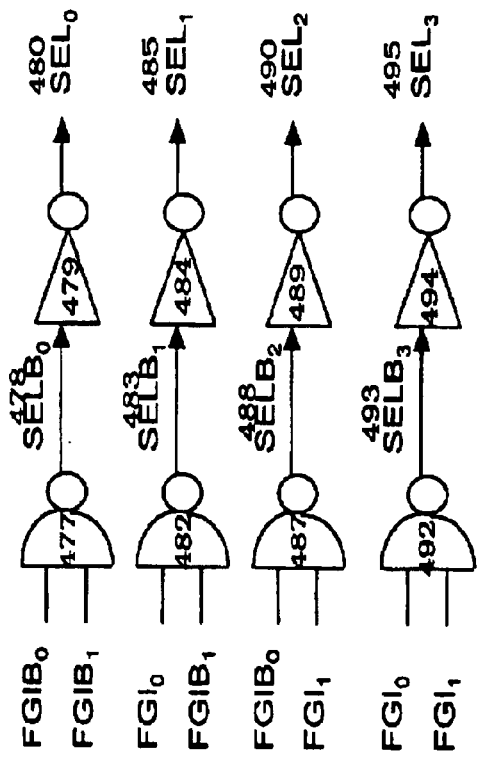
FIG. 4C is a signal diagram illustrating the signal relationship between the input signals and the select signals.
Figure 4B:
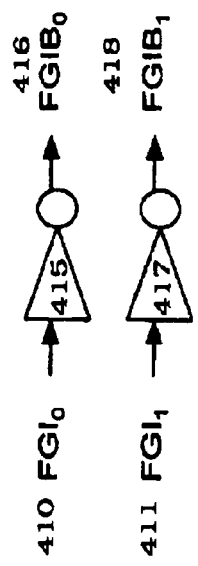
FIG. 4B is a signal diagram illustrating the signal relationship between various input signals.
Figure 4A:
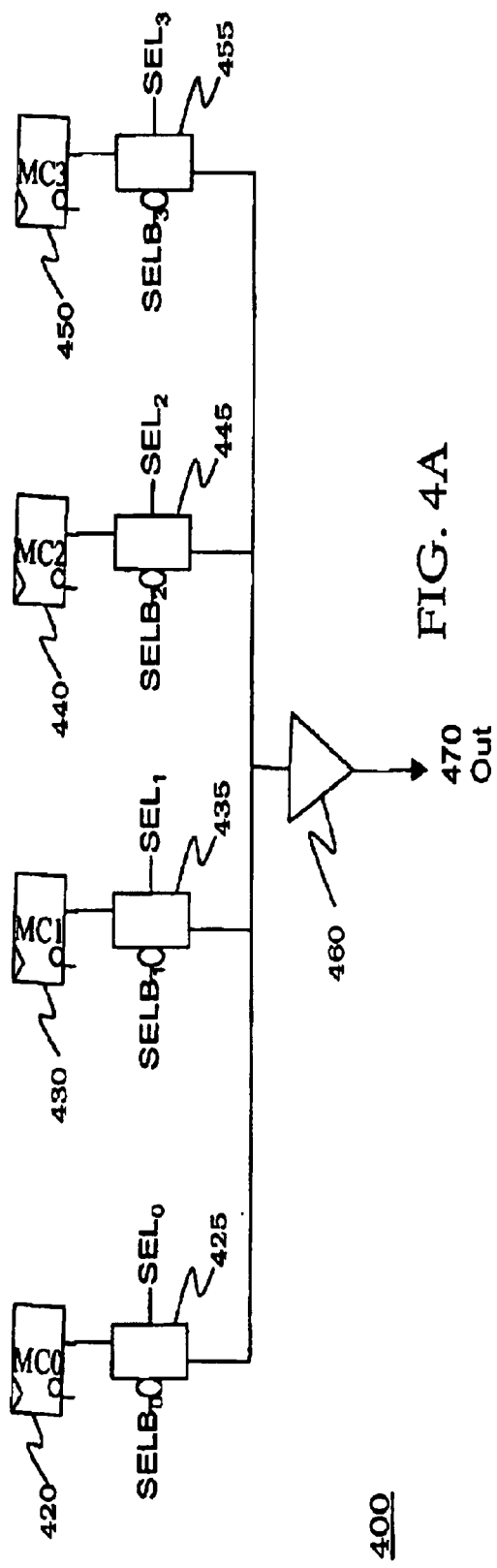
FIG. 4A is a circuit diagram illustrating an exemplary implementation of the programmable function generator operating as a 2-inputs combinational circuit in accordance with the present invention.

FIG. 4A is a circuit diagram illustrating an exemplary implementation of the programmable function generator 100 operating as a 2-inputs combinational circuit $FG\text{-}Comb_4$ 400 in accordance with the present invention. The FG-Combn 400 is an n-inputs combinational function generator having a set of configuration memory cells where the configuration memory cells are capable of configuring the FG-Combn 400 to generate any n-inputs combinational function. The combinational circuit 400 comprises two input signals $FGI_0$ 410 and $FGI_1$ 411, a first memory cell $MC_0$ 420, a first pass gate 425, a second memory cell $MC_1$ 430, a second pass gate 435, a third memory cell $MC_2$ 440, a third pass gate 445, a fourth memory cell $MC_3$ 450, a fourth pass gate 455, a buffer 460 and an output signal 470.

Depending on the input signals of $FGI_0$ 410 and $FGI_1$ 411, the 2-input combinational circuit 400 selects one of the memory cells, a first memory cell $MC_0$ 420, a second memory cell $MC_1$ 430, a third memory cell $MC_2$ 440 or a fourth memory cell $MC_3$ 450. When the input signals of $FGI_0$ 410 and $FGI_1$ 411 are both zero, the 2-input combinational circuit 400 selects the first memory cell $MC_0$ 420. When the input signal $FGI_0$ 410 is equal to one and the input signal $FGI_1$ 411 is equal to zero, the 2-input combinational circuit 400 selects the second memory cell $MC_1$ 430. When the input signal $FGI_0$ 410 is equal to zero and the input signal $FGI_1$ 411 is equal to one, the 2-input combinational circuit 400 selects the second memory cell $MC_2$ 440. When the inputs signals of $FGI_0$ 410 and $FGI_1$ 411 are both equal to one, the 2-input combinational circuit 400 selects the third memory cell MC$_3$ 440. Table 1 below summarizes in a truth table format on the selections made by the 2-input combinational circuit 400 as described above.

TABLE 1

| FGI$_0$ | FGI$_1$ | Out |
| --- | --- | --- |
| 0 | 0 | MC$_0$ |
| 1 | 0 | MC$_1$ |
| 0 | 1 | MC$_2$ |
| 1 | 1 | MC$_3$ |

The memory cells, i.e. the first memory cell MC$_0$ 420, the second memory cell MC$_1$ 430, the third memory cell MC$_2$ 440, and the fourth memory cell MC$_3$ 440, get written with information at power-up. The data for the memory cells 420, 430, 440, and 450 would vary depending on a desirable function.

FIG. 4B is a signal diagram illustrating the signal relationship between various input signals. The input signal FGI$_0$ 410 is inverted by an inverter 415 to generate a FGIB$_0$ signal 416. The input signal FGI$_1$ 411 is inverted by an inverter 417 to generate a FGIB$_1$ signal 418.

FIG. 4C is a signal diagram illustrating the signal relationship between the input signals and the select signals. A SEL$_0$ signal 480 is derived from an inverted SELB$_0$ 478 signal by an inverter 479, which is derived from an NAND gate 477 having two inputs, the FGIB$_0$ signal 416 and the FGIB$_1$ signal 418. A SEL$_1$ signal 485 is derived from an inverted SELB$_1$ 483 signal by an inverter 484, which is derived from an NAND gate 482 having two inputs, the FGI$_0$ signal 410 and the FGIB$_1$ signal 418. A SEL$_2$ signal 490 is derived from an inverted SELB$_2$ 488 signal by an inverter 489, which is derived from an NAND gate 487 having two inputs, the FGIB$_0$ signal 416 and the FGI$_1$ signal 411. A SEL$_3$ signal 495 is derived from an inverted SELB$_3$ 493 signal by an inverter 494, which is derived from an NAND gate 493 having two inputs, the FGI$_0$ signal 410 and the FGI$_1$ signal 411.

Figure 5:
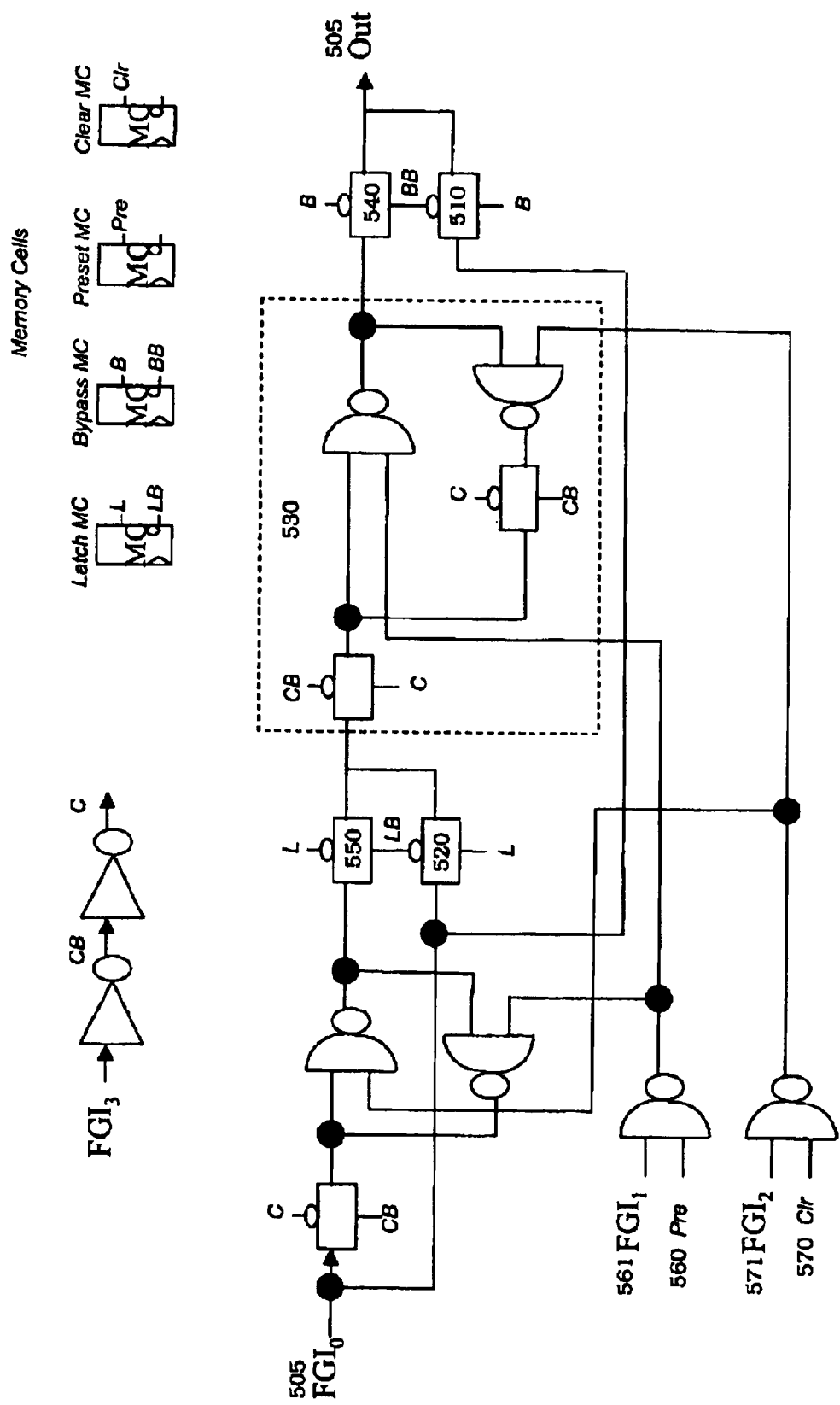
FIG. 5 is a circuit diagram illustrating an exemplary implementation of the programmable function generator operating as a configurable sequential circuit function in accordance with the present invention.

FIG. 5 is a circuit diagram illustrating an exemplary implementation of the programmable function generator 100 operating as configurable sequential function generator FG-Seq 500 in accordance with the present invention. The FG-Seq 500 is a sequential function generator where the inputs to the FG-Seq 500 cell includes data, clock enable, clear or preset signals, which are connected to the register in the FG-Seq 500 cell. Configuration memory cells in the FG-Seq 500 are capable of configuring the FG-Seq 500 as a rising edge flip-flop, a falling edge flip-flop, a positive level sensitive latch or a negative level sensitive latch. The configurable sequential function generator 500 is capable of operating as a level sensitive latch, an edge sensitive flip-flop, or a bypass circuit. The configurable sequential function generator 500 comprises a pass gate 510, a pass gate 520, a pass gate 540, a pass gate 550, and a circuit 530 that can function as a latch or a flip-flop. When the pass gate 510 is turned ON, the configurable sequential function generator 500 operates as a bypass circuit where an input signal FGIO 505 is bypassed directly to an output 580. When the pass gate 510 is turned OFF, the pass gate 540 is turned ON, and the past gate 520 is turned ON, the configurable sequential function generator 500 operates as a level sensitive latch in the circuit 530. When the pass gates 510 and 520 are both turned OFF, the configurable sequential function generator 500 operates as an edge sensitive latch in the circuit 530. When the pass gates 540 and 550 are both turned ON, the configurable sequential function generator 500 also operates as an edge sensitive latch in the circuit 530. Table 2 below summarizes in a truth table format of the various input combinations and the resulting configurations.

TABLE 2

| Latch MC | Bypass MC | Out |
| --- | --- | --- |
| 0 | 1 | FGI$_0$ |
| 1 | 0 | Level Sensitive Latch |
| 0 | 0 | Edge Sensitive Flip-flop |

When a preset signal 560 is set to 1 and a FGI$_1$ signal 561 is asserted high, the flip-flop is reset. When a clear signal 570 is set high and the FGI2 signal 571 is asserted high, the flip-flop is cleared.

Figure 6:
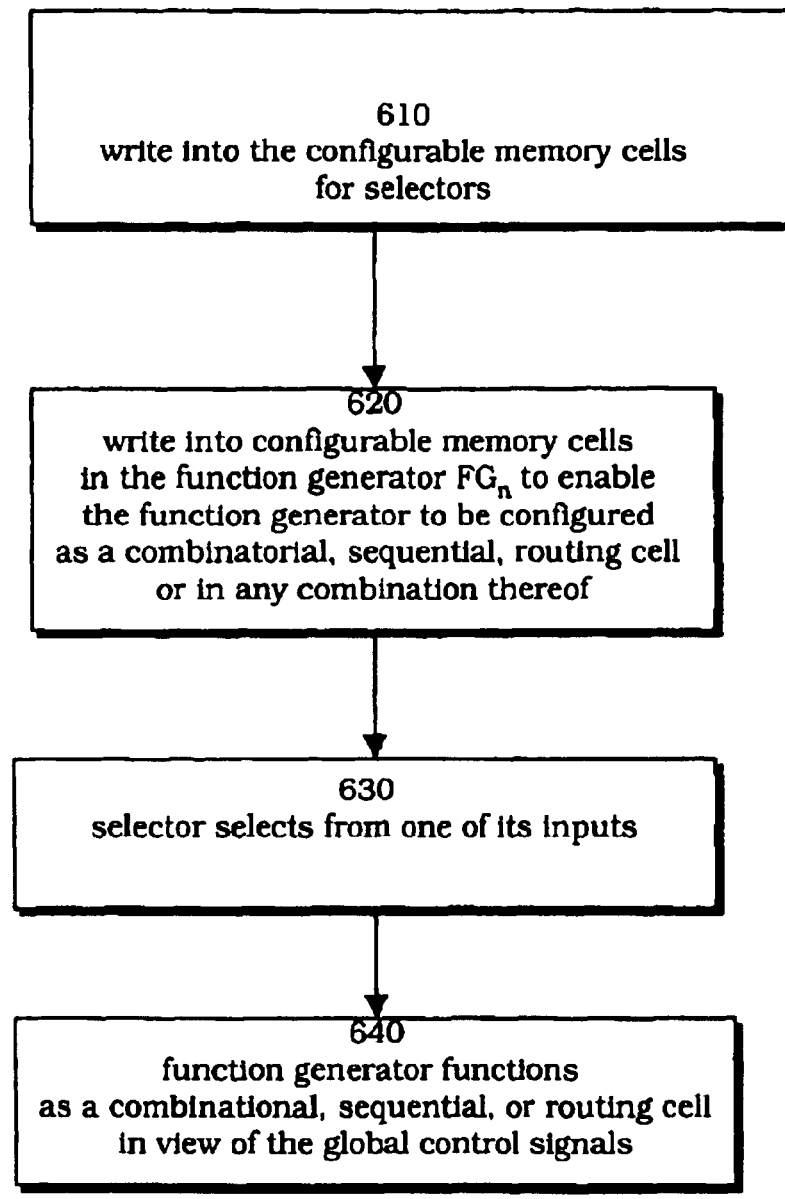
FIG. 6 is a flow chart illustrating the process in which the programmable function generator is configured as a combinational logic function generator, a sequential logic function generator or a routing function generator.

FIG. 6 is a flow chart illustrating a process 600 in which the programmable function generator 100 is configured as a combinational logic function generator, a sequential logic function generator or a routing function generator. At step 610, the process 600 writes into the configurable memory cells for selectors. At step 620, the process 600 writes into configurable memory cells in the programmable function generator FG$_n$ 100 for configuring memory cells to configure the programmable function generator 100 as a combinational logic function generator, a sequential logic function generator or a routing generator. At step 630, the selector selects from one of its inputs depending on what has been written into the memory cells. At step 640, the programmable function generator 100 functions as a combinational logic function generator, a sequential logic function generator or a routing function generator depending on the inputs from selector blocks as well as the global control signals.

A software program or computer-implemented-method may be used for generating values for a plurality of configuration memory cells in a function generator; and responsive to the values in the plurality of configuration memory cells, generating any functionality for a combinational function, a sequential function (including flip-flops and latches) or a routing function.

Nomenclatures used to describe the structure and the functions of the present invention are listed below with definitions of various terms. These definitions apply to the terms as they are used throughout the specifications, unless they are otherwise limited in specific instances either individually or as a part of a larger group. The term "logic-level representations" refers to any logic level-representation in electronic design method capable of being implemented by a plurality of programmable logic functions. The term "programmable logic function" refers to any configurable logic element that my include all of the circuit elements necessary to provide one or more of the logical functions provided by, for example, an AND gate, flip-flop, inverter, NOR gate exclusive OR gate, and combinations of these functions to form more complex functions. The term "interconnect" refers to any interconnect that connects logic-level representations within a programmable integrated circuit and to any wire that connects configurable logic elements among each other within any logic level representation. The term "adjacent" refers to any two logic-level representations located next to each other in the programmable integrated circuit structure. The term "switch matrix" refers to any sets of input lines and any set of output lines wherein any one set of input lines connected to any one corresponding set of output lines. The term "memory representations" refers to any memory array comprises a plurality of logic-level representations. The term "memory block" refers to any memory block comprises two or more configurable logic elements. An "programmable cell" is a cell that can be dynamically allocated as logic cell or routing cell of a programmable IC. The integrated cell comprises a plurality of a "selector block," "a function generator" and a "configuration memory cell." A "selector block" is an element of the "integrated cell" that selects a wire from a plurality of inputs as an input for the "function generator." A "function generator" is an element of the "integrated cell" that generates combinational and/or sequential functions. A "configuration memory cell" is an element of the "integrated cell" that configures different components for a particular functionality.

The above embodiments are only illustrative of the principles of this invention and are not intended to limit the invention to the particular embodiments described. Accordingly, various modifications, adaptations, and combinations of various features of the described embodiments can be practiced without departing from the scope of the invention as set forth in the appended claims.

We claim:

1. A programmable function generator $FG_n$ having n-inputs, comprising:
   an n-inputs combinational function generator having a set of configuration memory cells;
   a sequential function generator coupled to the n-inputs combinational function generator, the sequential function generator having a set of configuration memory cells;
   a route function generator, coupled to the sequential function generator, the route function generator having a set of configuration memory cells;
   a first selector block coupled to the programmable function generator, the first selector block having a plurality of input signals, the programmable function generator receiving a $FGI_2$ input signal from the plurality of input signals in the first selector block input; and
   a second selector block coupled to the programmable function generator, the second selector block having a plurality of input signals, the programmable function generator receiving a $FGI_1$ input signal from the plurality of input signals of the second selector block input;
   wherein the programmable function generator is configured to provide function of the n-inputs combinational function generator in response to the programming of the set of configuration memory cells in the programmable function generator, the sequential function generator in response to the programming of the set of configuration memory cells in the programmable function generator, or the route function generator in response to the programming of the set of configuration memory cells in the programmable function generator, or in any combination thereof
   wherein the programmable function generator can not be configured as only the sequential function generator.

2. The programmable function generator of claim 1, further comprising a third selector block coupled to the programmable function generator, the third selector block having a plurality of input signals, the function generator receiving a $FGI_{n-1}$ input signal from the plurality of input signals in the third selector block input.

3. The programmable function generator of claim 2, further comprising a plurality of global signals coupled to the programmable function generator.

4. The programmable function generator of claim 3, wherein the plurality of global control signals comprises a clock signal, a clear signal, a preset signal, a scan-data-in signal.

5. The programmable function generator of claim 3, wherein the function generator generates an output signal.

6. A programmable function generator $FG_n$ having n-inputs comprising:
   an n-inputs combinational function generator having a set of configuration memory cells;
   a sequential function generator coupled to the n-inputs combinational function generator, the sequential function generator having a set of configuration memory cells;
   a route function generator, coupled to the sequential function generator, the route function generator having a set of configuration memory cells;
   a first selector block coupled to the programmable function generator, the first selector block having a plurality of input signals, the programmable function generator receiving a $FGI_2$ input signal from the plurality of input signals in the first selector block input;
   k inputs;
   k memory cells coupled to k pass gates, where the k pass gates receive the k input signals and
   a buffer having an input commonly coupled to the k pass gates and having an output for generating $FGI_0$ input signal;
   wherein the programmable function generator is configured to provide function of the n-inputs combinational function generator in response to the programming of the set of configuration memory cells in the programmable function generator, the sequential function generator in response to the programming of the set of configuration memory cells in the programmable function generator, or the route function generator in response to the programming of the set of configuration memory cells in the programmable function generator, or in any combination thereof
   wherein the programmable function generator can not be configured as only the sequential function generator.

7. A programmable function generator $FG_n$ having n-inputs, comprising:
   an n-inputs combinational function generator having a set of configuration memory cells, comprising:
      n memory cells coupled to n pass gates;
      decoded functions of n inputs coupled to the n pass gates; and
      a buffer having an input commonly coupled to the n pass gates, and having an output;
   a sequential function generator coupled to the n-inputs combinational function generator, the sequential function generator having a set of configuration memory cells;
   a route function generator, coupled to the sequential function generator, the route function generator having a set of configuration memory cells;
   wherein the programmable function generator is configured to provide function of the n-inputs combinational function generator in response to the programming of the set of configuration memory cells in the programmable function generator, the sequential function generator in response to the programming of the set of configuration memory cells in the programmable function generator, or the route function generator in response to the programming of the set of configuration memory cells in the programmable function generator, or in any combination thereof
   wherein the programmable function generator can not be configured as only the sequential function generator.

8. A programmable function generator $FG_n$ having n-inputs, comprising:

an n-inputs combinational function generator having a set of configuration memory cells;

a sequential function generator coupled to the n-inputs combinational function generator, the sequential function generator having a set of configuration memory cells, comprising:
- a first pass gate;
- a second pass gate;
- a third pass gate, coupled to the second pass gate;
- a fourth pass gate, coupled to the second and third pass gate;
- a fifth pass gate;
- a sixth pass gate coupled to the fifth pass gate; and
- a functional circuit having an input coupled to the first and third pass gates, and having an output coupled to the fourth pass gate; wherein the functional circuit operates as a rising edge flip-flop, a falling edge flip-flop, a positive level sensitive latch or a negative level sensitive latch;

a route function generator, coupled to the sequential function generator, the route function generator having a set of configuration memory cells;

wherein the programmable function generator is configured to provide function of the n-inputs combinational function generator in response to the programming of the set of configuration memory cells in the programmable function generator, the sequential function generator in response to the programming of the set of configuration memory cells in the programmable function generator, or the route function generator in response to the programming of the set of configuration memory cells in the programmable function generator, or in any combination thereof wherein the programmable function generator can not be configured as only the sequential function generator.

* * * * *